(12) United States Patent
Chang et al.

(10) Patent No.: US 10,058,776 B2
(45) Date of Patent: Aug. 28, 2018

(54) KEY APPARATUS

(71) Applicant: ScienBiziP Consulting (Shenzhen) Co., Ltd., Shenzhen (CN)

(72) Inventors: Chia-Shou Chang, New Taipei (TW); Hsien-Jen Chen, New Taipei (TW); Chao-Te Lee, New Taipei (TW); Yao-Che Peng, New Taipei (TW)

(73) Assignee: ScienBiziP Consulting(Shenzhen)Co., Ltd., Shenzhen (CN)

(*) Notice: Subject to any disclaimer, the term of this patent is extended or adjusted under 35 U.S.C. 154(b) by 913 days.

(21) Appl. No.: 14/546,845

(22) Filed: Nov. 18, 2014

(65) Prior Publication Data

US 2016/0008712 A1 Jan. 14, 2016

(30) Foreign Application Priority Data

Jul. 10, 2014 (TW) .............................. 103123735 A

(51) Int. Cl.
*H01H 13/14* (2006.01)
*A63F 13/24* (2014.01)
*H03K 17/96* (2006.01)

(52) U.S. Cl.
CPC ............ *A63F 13/24* (2014.09); *H03K 17/962* (2013.01); *H03K 2217/960755* (2013.01)

(58) Field of Classification Search
CPC .......... G06F 3/044; G06F 2203/04103; G06F 2203/04111; G06F 3/03547
USPC ................................. 200/600, 5 A, 341–345
See application file for complete search history.

(56) References Cited

U.S. PATENT DOCUMENTS

| 2007/0074959 A1* | 4/2007 | Ikeda | ................... H01H 25/041 200/5 R |
| 2015/0341031 A1* | 11/2015 | Marquas | .............. G01D 5/2417 200/600 |

* cited by examiner

*Primary Examiner* — Edwin A. Leon
*Assistant Examiner* — Ahmed Saeed
(74) *Attorney, Agent, or Firm* — ScienBiziP, P.C.

(57) ABSTRACT

A key apparatus includes a housing with an opening, a printed circuit board (PCB) received in the housing, and a key mechanism. The key mechanism includes an electrode portion and a conducting portion sandwiched between the electrode portion and the PCB. The electrode portion is electrically connected to the PCB. The conducting portion is apart from the PCB. While the conducting portion connects with the connecting region, the electrode portion and the connecting region form a capacitor. The PCB generates different control signals based on different capacitances of the formed capacitors.

18 Claims, 5 Drawing Sheets

KEY APPARATUS

CROSS-REFERENCE TO RELATED APPLICATIONS

This application claims priority to Taiwanese Patent Application No. 103123735 filed on Jul. 10, 2014, the contents of which are incorporated by reference herein.

FIELD

The present disclosure relates to a key apparatus for improving touch sensitivity.

BACKGROUND

Key apparatuses, such as a game controller, include at least one pressed key, at least one rubber portion with conductive particles, and at least one pressing film. The pressing film defines different connected area ranges corresponding to different control signals respectively. When a key is pressed, the corresponding conductive particle connects with the pressing film for generating different control signals based on different connected areas.

BRIEF DESCRIPTION OF THE FIGURES

Implementations of the present technology will now be described, by way of example only, with reference to the attached figures.

DETAILED DESCRIPTION

Figure 1:
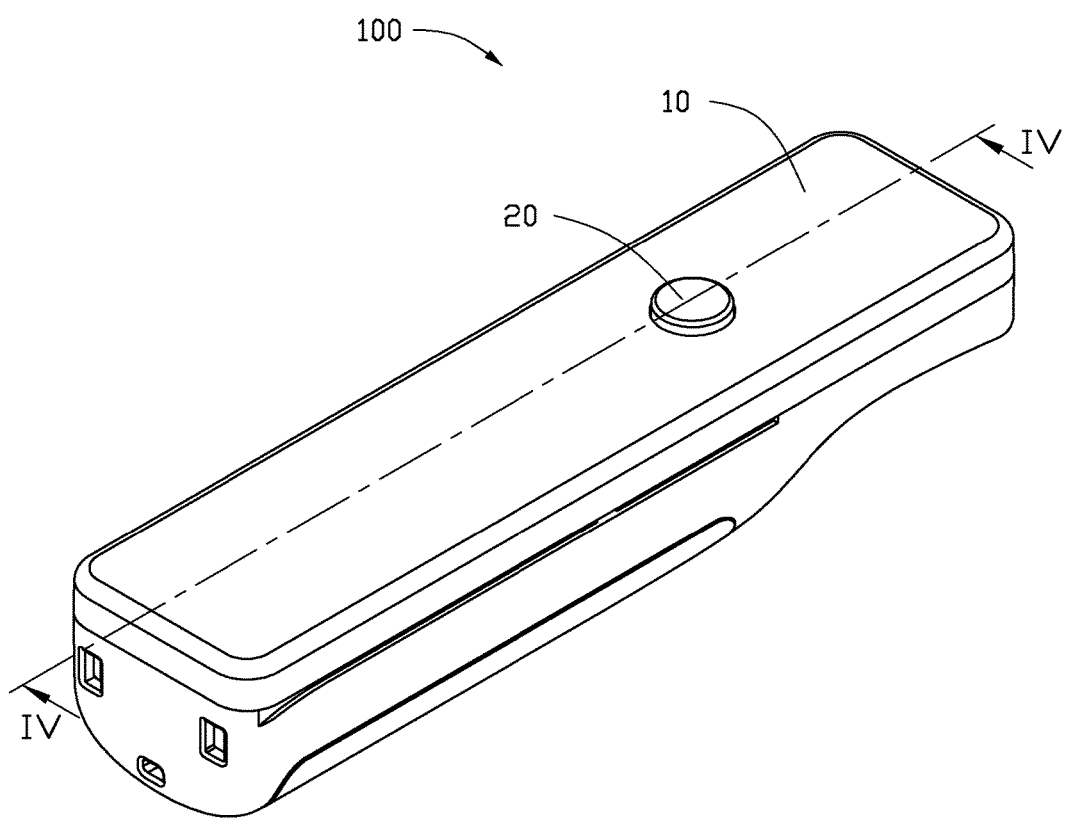
FIG. 1 is an isometric view of an embodiment of a key apparatus, the key apparatus comprising a rubber portion.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

A key apparatus capable of improving touch sensitivity is described.

FIG. 1 illustrates a key apparatus 100 of the embodiment. The key apparatus 100 generates different control signals for controlling an external device to execute a corresponding function based on different pressures. In the present embodiment, the key apparatus 100 is a game controller.

Figure 2:
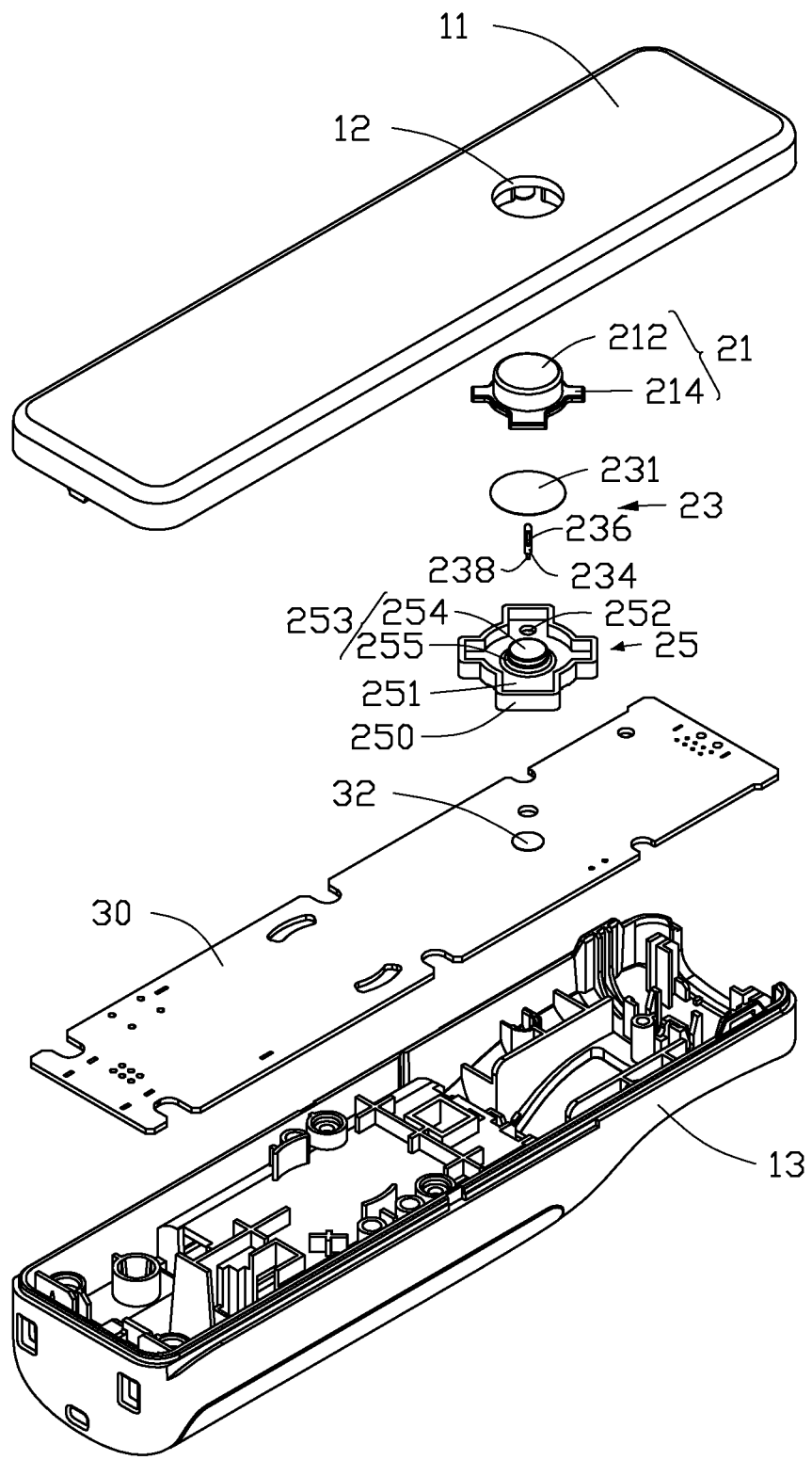
FIG. 2 is an exploded view of an embodiment of the key apparatus of FIG. 1.

FIG. 2 illustrates the key apparatus 100 includes a housing 10, a key mechanism 20, and a printed circuit bard (PCB) 30. The key mechanism 20 and the PCB 30 are received in the housing 10. Parts of the key mechanism 20 are exposed from the housing 10.

The housing 10 includes an upper cover 11 and a bottom cover 13 cooperated with the upper cover 11 to define a receiving space (not shown). The upper cover 11 defines an opening 12. In other embodiments, the upper cover 11 can define at least two openings 12.

The key mechanism 20 is located on the PCB 30. The key mechanism 20 includes a key 21, an electrode portion 23, and an elastic portion 25. The key 21 includes a first body 212 and a plurality of protruding portions 214. The first body 212 is substantially cylinder shaped. A diameter of first body 212 is less than a diameter of the opening 12. The protruding portions 214 adjacent to the bottom surface of the first body 212 are symmetrically protruded from the sidewall of the first body 212 along a direction perpendicular to an axis of the first body 212. The protruding portion 214 is substantially rectangular plate. In at least one embodiment, there are four protruding portions 214. The key 21 is made of elastic material. In other embodiments, the key mechanism 20 can include at least two keys 21 and at least two elastic portions 25 corresponding to the keys 21 in an one-to-one relationship.

The electrode portion 23 is located between the key 21 and the elastic portion 25. The electrode portion 23 includes a conducting plate 231 and a wire 234. The conducting plate 231 is substantially circle shaped. The wire 234 is substantially L-shaped. The wire 234 includes a first end 236 and a second end 238 perpendicular to the first end 236. The first end 236 is connected to a bottom surface of the conducting plate 231 facing the elastic portion 25. The second end 238 is connected to the PCB 30. In the embodiment, a diameter of conducting plate 231 is equal to a diameter of the first body 212.

Figure 3:
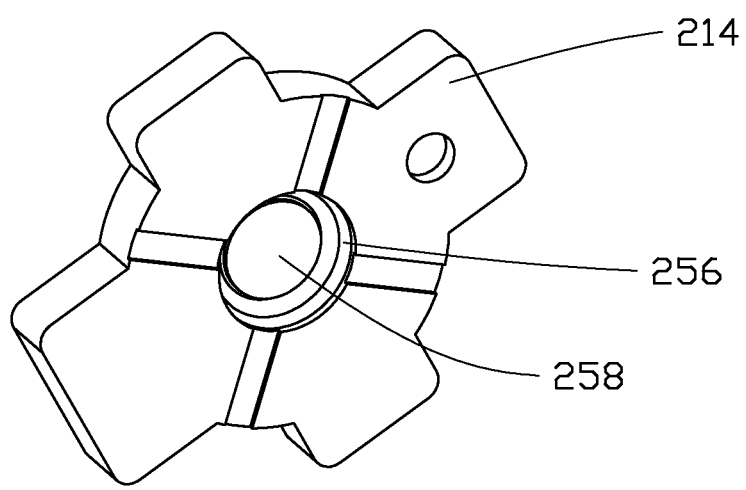
FIG. 3 is an isometric view of an embodiment of the rubber portion of FIG. 1 viewed from another angle.

FIG. 3 illustrates the elastic portion 25 is substantially cross-shaped. The elastic portion 25 is completely received in the housing and includes a second body 250, a receiving portion 251, an operation portion 253, a slot 254, and a triggering portion 258. The second body 250 is substantially cross-shaped.

The receiving portion 251 is concaved from a surface opposite to the second body 250. The receiving portion 251 is used for receiving the protruding portion 214. The receiving portion defines a groove 252 adjacent to a sidewall of the receiving portion 251.

The operation portion 253 is located on a central of the receiving portion 251. The operation portion 253 includes a protruding pole 254 and a connecting portion 255. The protruding pole 254 is substantially cylinder shaped. The protruding pole 254 is protruded from a central of the receiving portion 251 along a direction adjacent to the key 21. The protruding pole 254 supports the electrode plate 231 for forming an altitude difference with the PCB 30. An end of the protruding pole 254 passes through the receiving portion 251 and is received in the slot 256. The connecting portion 255 connects the protruding pole 254 and the receiving portion 251. The connecting portion 255 and a bottom surface of the receiving portion 251 define an angle. The connecting portion 255 is a substantially hollow frustum of a cone. An upper edge of the connecting portion 255 is connected to the protruding pole 254, and a lower edge of the connecting portion 255 is connected to a bottom surface of the receiving portion 251. In at least one embodiment, the connecting portion 255 is made of elastic material.

The slot 256 is concaved from a surface of the second body 250 along a direction away from the PCB 30. The slot 256 is substantially a frustum of a cone. The slot 256 receives an end of the protruding pole 254.

The triggering portion 258 is substantially a circle plate. The triggering portion 258 received in the slot 256. In at least one embodiment, the triggering portion 258 is made of rubber material mixed with carbon granule.

The PCB 30 is substantially a rectangular plate. The PCB 30 defines a connecting region 32 corresponding to the triggering portion 258. The connecting portion 32 resists with the triggering portion 258 to be conductive.

Figure 4:
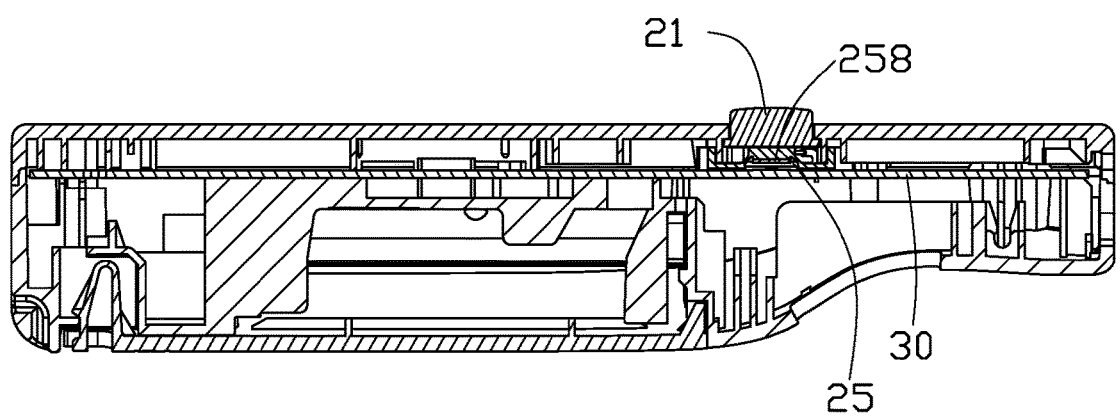
FIG. 4 is a cross-sectional view of an embodiment of the key apparatus of FIG. 1, taken along a line IV-IV thereof.

FIG. 4 illustrates the key apparatus 100 in assembly. The second body 250 is located on the PCB 30. The conducting plate 231 is located on the protruding pole 254, and sandwiches between the key 21 and the protruding pole 254. The second end 238 passes through the groove 252 and connects with the PCB 30. Partial of the key 21 is exposed from the housing via the opening 12. The triggering portion 258 spaces from the connecting region 32 in a predetermined distance. The predetermined distance is equal to the altitude difference.

Figure 5:
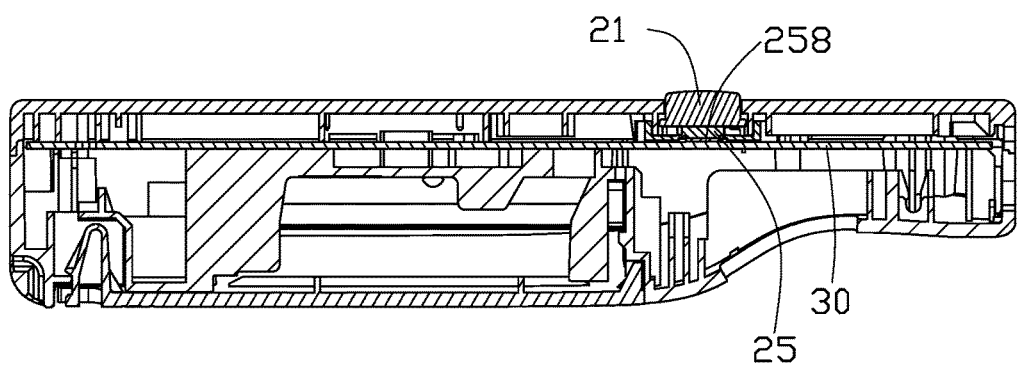
FIG. 5 is a cross-section view showing a key of the key apparatus being pressed.

Referring to FIG 5, while a force is pressed on the key 21, the key 21 drives the elastic portion 25 to move down along a direction adjacent to the PCB 30. The protruding portion 214 receives in the receiving portion 251 for preventing the key 21 to move along a horizontal direction. The protruding pole 254 drives the triggering portion 258 to resistwith the connecting region 32, which causes to form a capacitor between the conducting plate 231 and the connecting region 32. The PCB 30 generates different control signals based on different capacitances of the formed capacitors. The protruding pole 254 further deforms for decreasing a distance between the conducting plate 231 and the connecting region 32, which cause a capacitance change of the formed capacitor. The elastic portion 25 deforms to generate an elastic force along a direction away from the PCB 30. When the force pressed on the key 21 is released, the deformed elastic portion 25 drives the key 21 to resume to an original position based on the generated elastic force.

In use, the key apparatus 100 forms a capacitor for generating a controlling signal, and a sensitivity of the key apparatus 100 is improved by the pressure type connecting portion 32.

While various exemplary and preferred embodiments have been described, the disclosure is not limited thereto. On the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:
1. A key apparatus comprising:
a housing with an opening;
a printed circuit board (PCB) received in the housing; and
a key mechanism located on the PCB,
wherein the key mechanism comprises an electrode portion and an elastic portion sandwiched between the electrode portion and the PCB;
the elastic portion comprises a triggering portion separate from the PCB;
the triggering portion resists with the PCB when the triggering portion is pressed;
the electrode portion comprises a conducting plate and a wire; the wire comprises a first end and a second end perpendicular to the first end; the first end connects with the conducting plate, and the second end connects with the PCB by the triggering portion; the conducting plate and the PCB move relative to each other and form an adjustable capacitance capacitor; and
the PCB generates different control signals based on different capacitances of the formed capacitor.

2. The key apparatus of claim 1, wherein when the elastic portion resists with the PCB, a distance between the electrode portion and the PCB is changeable based on different pressures.

3. The key apparatus of claim 1, wherein the conducting plate is parallel with the PCB.

4. The key apparatus of claim 3, wherein the PCB comprises a connecting region corresponding to the elastic portion; the elastic portion comprises a slot faced to the PCB; the triggering portion is received in the slot; the triggering portion resists with the connecting region to cause the connecting region to be conductive; the conductive connecting region and the conducting plate form the capacitor.

5. The key apparatus of claim 4, wherein the key mechanism further comprises a key partly exposed from the opening; the elastic portion further comprises a receiving portion; the key is received in the receiving portion while being pressed.

6. The key apparatus of claim 5, wherein the slot and the receiving portion are respectively concaved from opposite surface of the elastic portion.

7. The key apparatus of claim 5, wherein the elastic portion further comprises an operation portion; the operation portion is located on a central of the receiving portion; the electrode portion is supported by the operation portion.

8. The key apparatus of claim 5, wherein the receiving portion defines a groove adjacent to a sidewall of the receiving portion; the second end of the wire passes through the groove for electrically connecting with the PCB.

9. A key apparatus comprising:
a housing with an opening;
a printed circuit board (PCB) received in the housing; and
a key mechanism located on the PCB;
wherein the key mechanism comprises a key, an electrode portion, and an elastic portion located on the PCB; the electrode portion is sandwiched between the key and the elastic portion; the key is partly exposed from the housing via the opening; the electrode portion and the elastic portion are completely received in the housing; the electrode portion comprises a conducting plate and a wire; the wire comprises a first end and a second end perpendicular to the first end; the first end connects with the conducting plate, and the second end connects with the PCB by the elastic portion; the PCB generates a corresponding control signal based on a position of the conducting plate relative with the PCB.

10. The key apparatus of claim 9, wherein the key comprises a first body and a plurality of protruding portions; the protruding portions are symmetrically located on sidewall of the first body along an axis of the first body; while the elastic portion resists with the PCB, the protruding portions are received in the elastic portion for preventing the key to move along a horizontal direction.

11. The key apparatus of claim 9, wherein the elastic portion further comprises a triggering portion separate from the PCB; the PCB comprises a connecting region; the key drives the triggering portion to resist with the connecting region for causing the connecting region to be a conductive connecting region, the electrode portion and the conductive connecting region form a capacitor; a capacitance of the capacitor varying based on different pressures applied to the triggering portion, which cause a distance between the electrode portion and the conductive region to change, thereby changing a capacitance of the capacitor.

12. The key apparatus of claim 11, wherein the conducting plate is parallel with the PCB.

13. The key apparatus of claim 12, wherein the elastic portion comprises a slot faced to the PCB; the triggering portion is received in the slot.

14. The key apparatus of claim 13, wherein the elastic portion further comprises a receiving portion; the key is received in the receiving portion while being pressed; the slot and the receiving portion are respectively concaved from opposite surface of the elastic portion.

15. The key apparatus of claim 14, wherein the elastic portion further comprises an operation portion; the operation portion is located on a central of the receiving portion; the electrode portion is supported by the operation portion.

16. The key apparatus of claim 14, wherein the receiving portion defines a groove adjacent to a sidewall of the receiving portion; the second end of the wire passes through the groove for electrically connecting with the PCB.

17. The key apparatus of claim 15, wherein the operation portion comprises a protruding pole and a connecting portion; the protruding pole supports the electrode portion; when an external force is provided on the key mechanism, the protruding pole and the connecting portion deform to respectively generate an elastic force in that order; the key mechanism resumes to an original position when the external force is released.

18. The key apparatus of claim 17, wherein the connecting portion connects between the protruding pole and the receiving portion; the connecting portion and a bottom surface of the receiving portion define an angle.

\* \* \* \* \*